United States Patent [19]

Watanabe et al.

[11] Patent Number: 5,525,899
[45] Date of Patent: Jun. 11, 1996

[54] PHYSICAL QUANTITY CHANGE DETECTION DEVICE WHICH DETECTS CHANGE BY DETECTING A PHASE DIFFERENCE BETWEEN TWO PULSES

[75] Inventors: Takamoto Watanabe, Nagoya; Haruo Kawakita, Okazaki; Seiki Aoyama, Toyohashi, all of Japan

[73] Assignee: Nippondenso Co., Ltd., Kariya, Japan

[21] Appl. No.: 348,088

[22] Filed: Nov. 25, 1994

[30] Foreign Application Priority Data

Nov. 26, 1993 [JP] Japan ................................. 5-296565

[51] Int. Cl.$^6$ .......................... G01R 25/00; G01R 23/02; G01R 33/09; H03K 5/26
[52] U.S. Cl. .............. 324/166; 324/207.12; 324/207.21; 324/252; 324/76.55; 324/76.62; 324/76.82; 327/4; 327/12; 327/43; 377/43
[58] Field of Search ................................. 324/252, 76.52, 324/76.55, 76.62–76.64, 76.77, 76.82, 161, 166, 173, 174, 207.12, 207.21, 207.25; 377/43; 327/3, 4, 12, 40, 41, 43, 48, 49; 331/65

[56] References Cited

U.S. PATENT DOCUMENTS 5,128,624  7/1992  Hoshino et al. .
5,134,371  7/1992  Watanabe et al. ....................... 324/252

FOREIGN PATENT DOCUMENTS 537378  2/1993  Japan .

Primary Examiner—Gerard R. Strecker
Attorney, Agent, or Firm—Cushman, Darby & Cushman

[57] ABSTRACT

An object of the present invention is to provide an A/D conversion device capable of compensating for quantizing errors occurring as a result of variations in operating conditions and a physical quantity detection device using this A/D conversion device. In a physical quantity detection device, pulse signals CKA and CKB, having frequencies which change in response to a change in magnetic strength, are caused to be output from oscillators 16 and 18, with counter/decoder sections 22 and 24 generating, from each of these pulse signals CKA and CKB, pulse signals PA and PC, and a pulse signal PB having a phase difference with respect to pulse signal PA which varies in a prescribed manner in response to the oscillation frequency of oscillator 16, the phase difference between pulse signals PA and PC and the phase difference between pulse signals PA and PB each being quantized by a pulse phase difference encoding circuit 30, with the ratio DD (=DB/DD) between the quantized digital values DC and DB being determined by a divider 50, and a detection signal PO, which represents the magnetic change being detected from this value DD, being generated.

5 Claims, 5 Drawing Sheets

PHYSICAL QUANTITY CHANGE DETECTION DEVICE WHICH DETECTS CHANGE BY DETECTING A PHASE DIFFERENCE BETWEEN TWO PULSES

BACKGROUND OF THE INVENTION

1. Field of the Invention

The present invention relates to a physical quantity detection device that detects a physical quantity of the object under detection, and more specifically it relates to a physical quantity detection device which outputs the value of a physical quantity as a digital value. It is suitable for application in, for example, rotational sensors for electric automobiles or other vehicles.

2. Description of the Related Art

In the past, there have been devices developed which control, by means of feedback control, the operating conditions (for example, the rum or position of an object under detection) of a controlled system, such as a vehicle engine, by a variety of sensors (for example, an rpm sensor), a microcomputer being used in these devices to achieve highly accurate control. In these devices, because the analog detection signals obtained from the above-noted sensors cannot be handled as is, the signals from the sensors are captured by means of digitization (encoding).

Examples of devices which detect a physical quantity such as position or rotational speed of the object under detection are those disclosed in the Japanese Unexamined Patent Publication (KOKAI) No. 3-125514 and the Japanese Unexamined Patent Publication (KOKAI) No. 3-220814. The physical quantity detection devices of both No. 3-125514 and No. 3-220814 operate as follows. A pair of oscillating devices each comprising a detection element having characteristics which change in accordance with the change of a physical quantity of an object under detection and an oscillation device, the oscillation frequency of which changes in accordance with change in characteristics of the detection element, is used to generate two pulse signals having a phase difference between them that varies in accordance with the variation in the physical quantity, the phase difference between these pulse signals being encoded by means of a pulse phase difference encoding circuit (a circuit which converts a time difference to a digital value), this phase difference being proportional to the physical quantity that was to be detected. While both of the above-mentioned pulse phase difference encoding circuits have the defects that the encoded value varies with respect to changes in operating conditions such as power supply voltage and ambient temperature, so that the output thereof is different than the true value, the physical quantity detection devices of Japanese Unexamined Patent Publication (KOKAI) Nos. 3-12551 and 3-22081, by detecting the phase difference of the above-noted pulse signals, cancel out the variations caused by changes in operating conditions such as power supply voltage and ambient temperature.

However, because the pulse phase difference encoding circuit used in the physical quantity detection devices of Japanese Unexamined Patent Publication Nos. 3-125514 and 3-220814 obtain a value of the physical quantity by detecting the phase difference between two pulse signals, although it is possible to cancel out variations occurring in the pulse phase difference encoding circuit which are caused by variations in operating conditions such as power supply voltage and ambient temperature for the case in which operating conditions such as power supply voltage and ambient temperature vary slowly with respect to time, a problem existed in that it was not possible to cancel out the variations occurring in the pulse phase difference encoding circuit in the case in which the power supply voltage varies rapidly with respect to time.

The time A/D conversion circuit (pulse phase difference encoding circuit) shown in FIG. 7 was proposed, as disclosed by the inventors of the present invention in Japanese Unexamined Patent Publication No. 5-37378, for the purpose of suppressing errors caused by rapid changes in the power supply voltage with respect to time.

This time A/D conversion circuit, which is a circuit which converts a time difference as noted above to a digital value, operates as follows. First, the start signal PA is input, after which the signal to be timed PB is input. Additionally, time reference signal PC is input, this signal being generated by a crystal oscillator and having a stable frequency which is not influenced by temperature or power supply voltage variations. As shown in the drawing, the time difference between PB and PA is detected by a pulse phase difference encoding circuit 108a, and the circuit 108a outputs signal $D_{AB}$, and the time difference between PC and PA is detected by the pulse phase difference encoding circuit 108b, and the circuit 108b outputs signal $D_{AC}$. $D_{AB}$ is then divided by $D_{AC}$ to determine the signal time $D_{AB}$ with respect to the reference time $D_{AC}$, thereby outputting a stable measured time that is not influenced by variations in temperature and power supply voltage.

However, in the above-noted time A/D conversion circuit shown in Japanese Unexamined Patent Publication (KOKAI) NO. 5-37378, even though a signal generated by a crystal oscillator is used as time reference and the time is measured with high accuracy, it is very difficult to detect a physical quantity of the object to be measured.

SUMMARY OF THE INVENTION

An object of the present invention is to provide a physical quantity detection device which uses a pulse phase difference encoding circuit in which variations occurring in the pulse phase difference encoding circuit, caused by rapid variation of the power supply voltage with respect to time, are canceled out.

To achieve the above-stated object, the essential elements of a physical quantity detection device of the first embodiment of the present invention are: a first oscillation means which outputs a first pulse signal, the frequency of which increases with an increase in a physical quantity; a second oscillation means which outputs a second pulse signal, the frequency of which decreases with an increase in a physical quantity; a first pulse generation means which repeats the operations of receiving the first pulse signal, starting to count this first pulse signal from a prescribed starting time, and then outputting the output pulse signal PC when the counted number of the output pulse signals PC reaches a first prescribed number, a second pulse generation means which repeats the operations of receiving the 2nd pulse signal, starting to count this 2nd pulse signal from a prescribed starting time, and then outputting the output pulse signal PB when the counted number of the output pulse signals PB reaches a second prescribed number.

a pulse phase difference measurement means which measures the amount of time from the above-noted prescribed starting time to the output of the output pulse signal PC, and along with outputting a first time signal corresponding to the measured time, also measures the amount of time from the above-noted starting time to the output of the output pulse signal PB and outputs a second time signal corresponding to the measured time; and a ratio output means which determines and outputs the ratio of above-noted first time signal to the above-noted second time signal.

To achieve the above-stated object, in a physical quantity detection device of the second embodiment of the present invention, in addition to the configuration described above, the above-noted first oscillation means has a physical quantity detection element having a value that increases as the value of the physical quantity acting on it increases and a first oscillator which is connected to the above-noted physical quantity detection element and which outputs a pulse signal CKA having an oscillation frequency which increases with an increase in the detected value, and further the above-noted second oscillation means has a physical quantity detection element having a value that decreases as the value of the physical quantity acting on it increases and a second oscillator which is connected to the above-noted physical quantity detection element and which outputs a pulse signal CKB having an oscillation frequency which decreases with an decrease in the detected value. In addition, the above-noted first pulse generation means inputs the above-noted pulse signal CKA from the first oscillator and counts the number of pulses of this pulse signal CKA, outputting a pulse signal PA until the counted value reaches a third prescribed number, and outputting the above-noted output pulse signal PC when the counted value reaches a first prescribed number. Furthermore, the above-noted second pulse generation means inputs the above-noted pulse signal CKB from the above-noted second oscillator and counts the number of pulses of this pulse signal CKB, this counting starting simultaneously with the start of the counting of the pulses of the pulse signal CKA by the above-noted first counter/decoder section, and has a second counter/decoder section which outputs the above-noted output pulse signal PB when the counted value of the number of pulses of the pulse signal CKB reaches a second prescribed number. Furthermore, the above-noted pulse phase difference encoding circuit accepts the pulse signal PA and the pulse signals PB and PC output from the above-noted first and second counter/decoder sections, and outputs digital values DB and DC which correspond respectively to the time from the rising edge of pulse signal PA to the rising edge of output pulse signal PB and to the time from the rising edge of pulse signal PA to the rising edge of output pulse signal PC, and the ratio output means determines and outputs the ratio of the above-noted digital values DB and DC.

In addition, to achieve the above-stated object, in addition to the elements of the above-described first embodiment of the present invention, in a physical quantity detection device of the third embodiment of the present invention the above-noted first oscillation means as a physical quantity detection element having a value that increases as the size of the physical quantity acting on it increases and a first oscillator which is connected to the above-noted physical quantity detection element and which outputs a pulse signal CKA having an oscillation frequency which increases with an increase in the detected value, and further the above-noted second oscillation means has a physical quantity detection element which has the same characteristics as the above-noted first physical quantity detection elements, and a second oscillator which is connected to the above-noted physical quantity detection element and which outputs a pulse signal CKB having an oscillation frequency which decreases with an increase in the detected value.

In a physical quantity detection device there are two pulse signals formed, a first pulse signal, which has a frequency that increases, and a second pulse signal, which has a frequency that decreases with respect to a varying physical quantity. In addition, the prescribed number of pulses in the first and second pulse signals, respectively, are counted, the amount of time required to count the prescribed number of pulses being measured by a pulse phase difference encoding means in order to convert the size of the above-noted physical quantity to two times. Because these two times are measured by one and the same pulse phase difference encoding means, they include the same error. However, by determining the ratio between these two times, it is possible to cancel out this error when outputting the physical quantity signal. In the present invention, because the ratio of two times is determined, even if there are variations within the pulse phase difference encoding means caused by rapid time variations of the power supply voltage, it is possible to cancel out these variations. By being able to cancel out variations caused by rapid time variations of the power supply voltage, it is of course possible to cancel out variations caused by slow time variations of the power supply voltage.

DESCRIPTION OF THE PREFERRED EMBODIMENTS

An embodiment of the present invention will be described below, with reference to the drawings.

Figure 1:
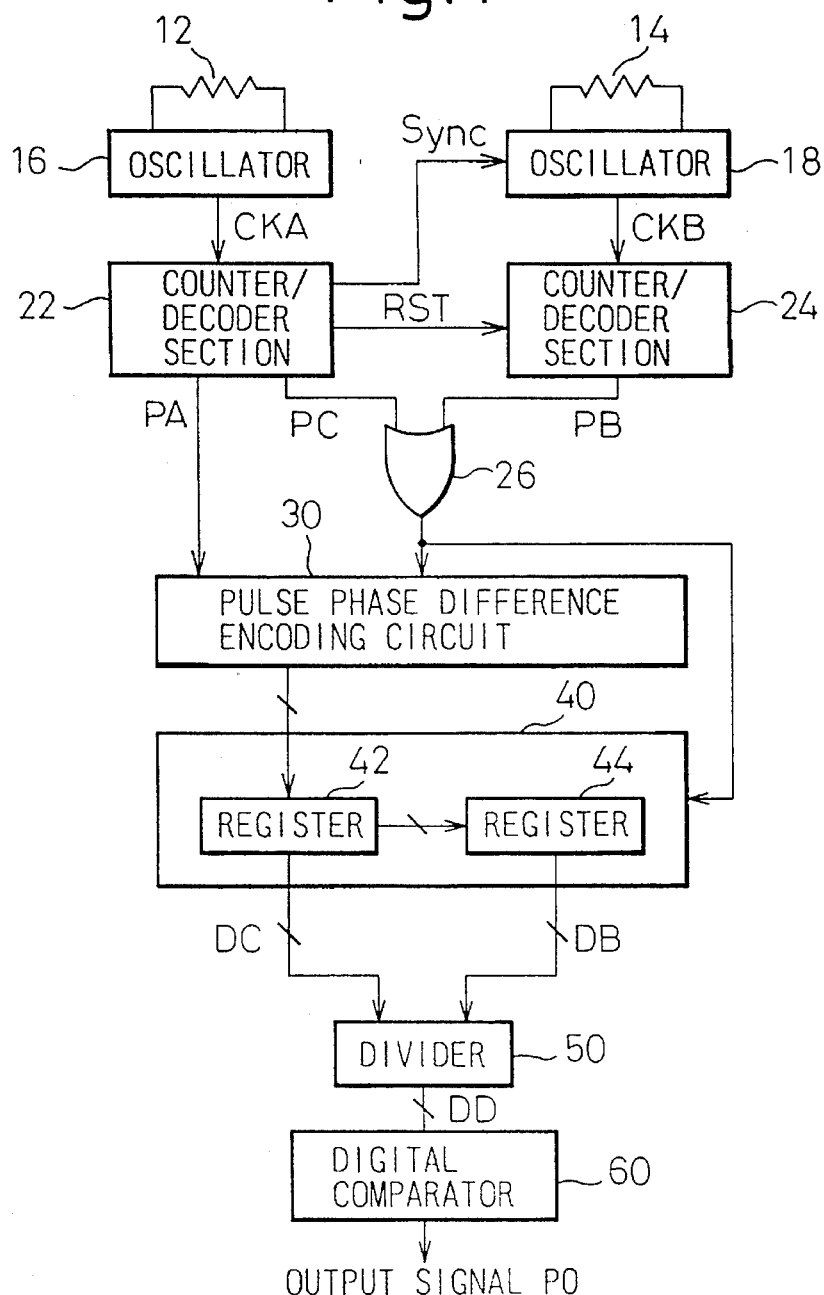
FIG. 1 is a block diagram which shows the overall configuration an embodiment of a physical quantity detection device of the present invention.

First, FIG. 1 is a block diagram which shows the configuration of a physical quantity detection device to which the present invention has been applied. This embodiment has, as a time A/D conversion means, the pulse phase difference encoding circuit disclosed in Japanese Unexamined Patent Publication (KOKAI) No. 3-220814, and detects the physical quantity magnetism.

As shown in FIG. 1, the physical quantity detection device of this embodiment has a pair of magneto-resistive elements 12 and 14, the resistances of which change in response to magnetic strength. These two magneto-resistive elements 12 and 14 have the same shape, and are disposed so that a longitudinal axis of one of the magneto-resistive elements is arranged perpendicular to that of another magneto-resistive element. Therefore, a direction of the change in resistance value of one of the elements for the same change in magnetism is opposite to that of another element.

The magneto-resistive elements 12 and 14 are connected, to a pair of oscillators 16 and 18, respectively, the oscillation frequency of the oscillators varying in response to variations in the resistance of the magneto-resistive elements 12 and 14. Each of the oscillators 16 and 18 has a built-in wave-shaping circuit, and these oscillators generate the pulse signals CKA and CKB (refer to FIG. 5) which have frequencies equal to the oscillation frequencies established by the resistance values of the magneto-resistive elements 12 and 14, the pulse signals CKA and CKB being output to the counter/decoder sections 22 and 24, respectively.

Figure 2:
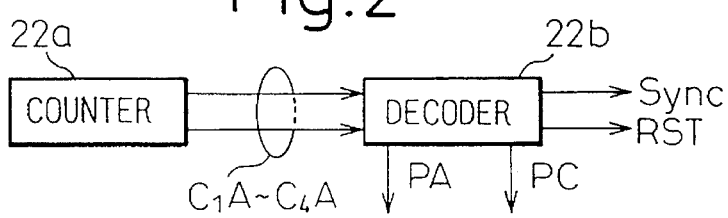
FIG. 2 is a block diagram which shows the configuration of a counter/decoder section 22 of an embodiment of the present invention.

The counter/decoder section 22 which receives the pulse signal CKA from oscillator 16, as shown in FIG. 2, is formed by counter 22a, which counts the pulse signal CKA and outputs count signals CLA to C4A, and decoder 22b, which receives these count signals C1A to C4A, outputting a pulse signal PA (refer to FIG. 5) from the start of counting until the count value of counter 22a reaches a prescribed value (9 in this embodiment) and which also outputs pulse signal PC (refer to FIG. 5) when the count value reaches a prescribed value (8 in this embodiment).

Although it is not illustrated, counter 24 which receives the pulse signal CKB from oscillator 18, in generally the same manner as described for the counter/decoder section 22, is formed by a counter which counts the pulse signal CKB and a decoder which outputs a pulse signal PB (refer to FIG. 5) until the count value counted by the counter reaches a prescribed value (5 in this embodiment).

The decoder 22b within counter/decoder section 22 not only outputs the pulse signals PA and PB, but also, when the count value of counter 22a reaches a prescribed value (9 in this embodiment), outputs a reset signal RST which resets both the counter 22a and the counter within the counter/decoder section 24, and outputs the synchronization signal Sync with respect to oscillator 18 for the purpose of synchronizing the next start of counting by both these counters.

Of the pulse signals PA to PC which are output from the above-noted counter/decoder sections 22 and 24, pulse signal PA is input as is to the pulse phase difference encoding circuit, while pulse signals PB and PC pass through an OR circuit, the output of which is input to a pulse phase difference encoding circuit 30 and to a register circuit 40.

Figure 3:
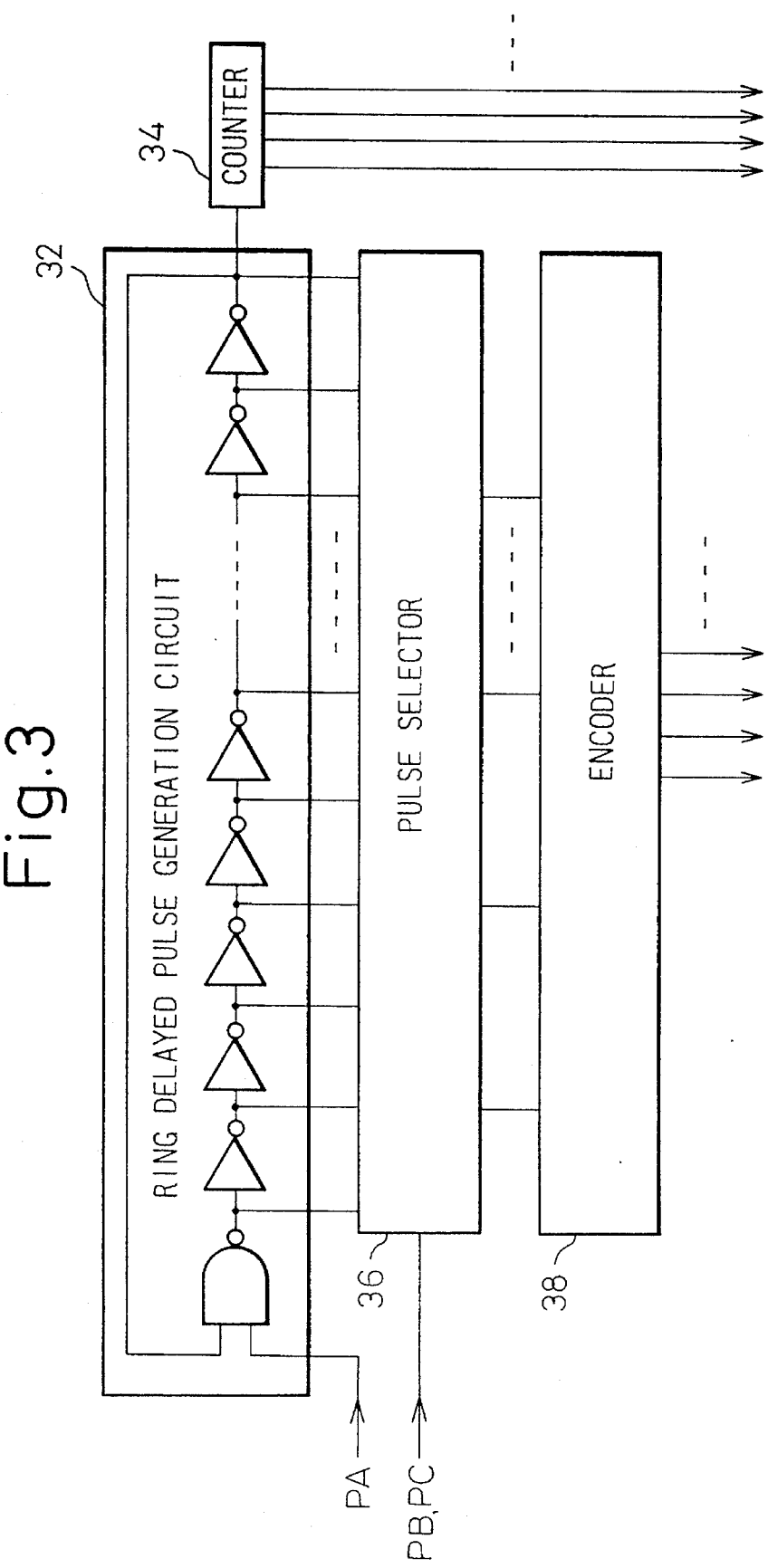
FIG. 3 is a block diagram which shows the configuration of the pulse phase difference encoding circuit of an embodiment of the present invention.

As shown in FIG. 3, pulse phase difference encoding circuit 30 is formed by a ring delayed pulse generation circuit 32 which consists of a NAND circuit and an even number of inversion circuits (inverters) connected in ring fashion, counter 34, a pulse selector 36, and an encoder 38, with pulse signal PA being input to one input of the NAND circuit which is part of the ring delayed pulse generation circuit 32, and with pulse signals PB and PC being input to the pulse selector 36.

This pulse phase difference encoding circuit 30 is basically the same as the one disclosed in the Japanese Unexamined Patent Publication Hei 3-220814, and this circuit operates as follows.

First, because the pulse signal PA iS input to the NAND circuit of the ring delayed pulse generation circuit 32, if the pulse signal PA is at low level, the output of the NAND circuit is fixed at a high level. Next, when the pulse signal PA becomes a high level, the output of the NAND circuit is inverted from high level to low level, after which the outputs of the linked inverters connected to the output of the NAND circuit change in sequence. Because the number of inverters is even, the output of the last inverter in the chain will be low, causing a low-level signal to be input to the NAND circuit. As a result, the output of the NAND circuit is inverted from low level to high level, and the outputs of the linked inverters connected to the output of the NAND circuit change in sequence once again.

In essence, in the ring delayed pulse generation circuit 32, as long as the pulse signal PA is not at a high level, the output of each of the inverters is fixed at (reset to) a prescribed level, and when the pulse signal PA changes to high level, pulse signal PA circulates with a delay time established by the circuits forming the ring.

Furthermore, in the ring delayed pulse generation circuit 32, there are a plurality of delayed pulses which are output to the pulse selector 36 from locations midway in the signal path at which points the NAND circuit and number of the inverter stages traversed determine the delay time. Each time the pulse signals PB and PC are input, the pulse selector 36 selects the delayed pulse of the stage to which the pulse signal PA has reached, and outputs a signal corresponding to this selected delayed pulse to the encoder 38. The encoder 38 then outputs a binary digital signal corresponding to this input.

The number of circulations of pulse signal PA within ring delayed pulse generation circuit 32 is counted by counter 34, the result of this counting being output as the uppermost order bit of the output of the encoder 38. This counter 34 operates so as to count on both the rising edge and the falling edge of the input signal.

As a result, digital values DB and DC (refer to FIG. 5), corresponding respectively to the time from the rising edge of the pulse signal PA to the rising edge of the pulse signal PB, and the time from the rising edge of the pulse signal PA to the rising edge of the pulse signal PC are output sequentially from the ring delayed pulse generation circuit 30.

Next, the register 40 receives the output signal resulting from passing the pulse signals PB and PC through OR circuit 26 and latches the digital values of DB and DC which are sequentially output from the pulse phase difference encoding circuit 30, this register 40 being in the configuration of a shift register which is formed by register 42, which directly latches the digital values from the pulse phase difference encoding circuit 30, and register 44, which latches digital values which were latched by register 42.

In essence, at the register circuit 40, when the digital value DB is output from the pulse phase difference encoding circuit 30, this value of DB is temporarily latched into register 42 by means of pulse signal PB, and subsequently when the digital value DC is output from the pulse phase difference encoding circuit 30, this value DC is latched into register 42 by means of the pulse signal PC, and the digital value DB which had been latched into register 42 being shifted to the register 44.

Therefore, at the point in time in which the above-noted counter/decoder sections 22 and 24 are reset by means of the reset signal RST, the digital value DC, which represents the phase difference between pulse signals PA and PC is latched by register 42, and the digital value DB, which represents the phase difference between the pulse signals PA and PB is latched by register Next, the digital values DB and DC that are latched in this manner by register circuit 40 are input to divider 50. This divider 50 divides the digital value DB by the digital value DC, the resulting DD (DD=DB/DC) being output as the value which represents the magnetic strength acting on the magneto-resistive elements 12 and 14.

That is, of the digital values DB and DC which are latched by the register 40, the digital value DB, which represents the phase difference between the pulse signal PA and the pulse signal PB corresponds to the time for five occurrences of the pulse signal CKB which is output from the oscillator 18, and because this varies in response to the oscillation frequency of oscillator 18 or, stated differently, because it varies in response to the magnetic strength detected by magnetoresistive element 14, the magnetic strength that this device should detect can be detected from the change in this digital value DB.

However, when there is a variation in the operating conditions of this device, such as the power supply voltage or ambient temperature, the oscillation frequency of the oscillator 18 and the operating times of the NAND circuit and inverters or other elements within the pulse phase difference encoding circuit 30 change, resulting in a change as well in the digital value DB obtained by the pulse phase difference encoding circuit 30. For example, in FIG. 5, in the case in which the power supply voltage VDD changes, even if there is no actual change occurring in the magnetic strength, the digital value DB might change from 50 to 40. Therefore, it is not possible with the digital value DB alone to detect the magnetic change accurately.

To solve this problem, in this embodiment of the present invention, a pulse signal PC is generated, by means of the pulse signal CKA from the oscillator 16, which operates under the same conditions as the oscillator 18, this pulse signal having a phase difference with respect to pulse signal PA which corresponds to 8 occurrences of the pulse signal CKA. The phase difference of this signal is quantized by the pulse phase difference encoding circuit 30, thereby generating a digital value DC which varies at the same rate with respect to variations in operating conditions as does the digital value DB. Additionally, the divider 50 is used to divide the digital value DB by the digital value DC, thereby obtaining digital value DD, which varies only with respect to variations in the actual magnetic strength.

Figure 5:
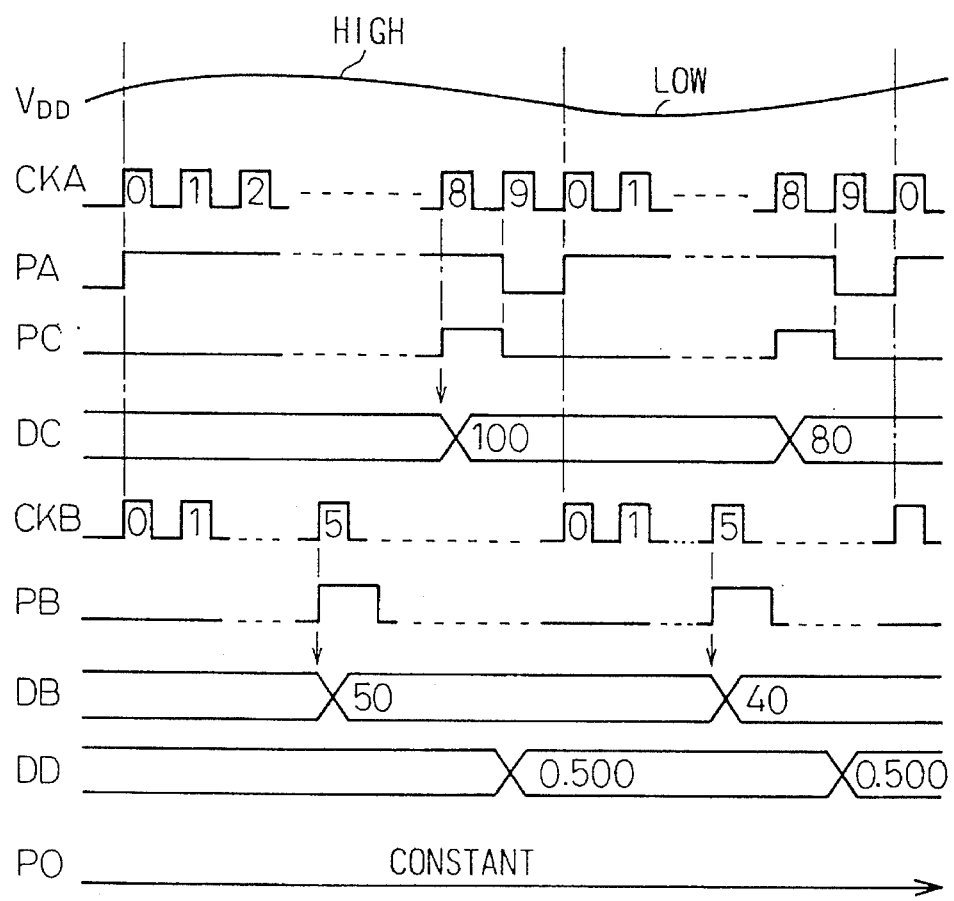
FIG. 5 is a time chart which shows the operation of the physical quantity detection device of an embodiment of the present invention.

As a result, in the case of FIG. 5, if for example the power supply voltage VDD varies so as to cause the digital value DB to change from 50 to 40, the digital value DC will change accordingly from 100 to 80, so that the digital value DD obtained by the divider 50 will be a constant value (0.5).

Furthermore, because the digital value DC varies in response to variation of the oscillation frequency of oscillator 16, or stated different because it varies in response to variation in the magnetic strength detected by the magnetoresistive element 12, when a change occurs in the magnetic strength, it varies in the opposite direction from the digital value DB. Therefore, when an actual magnetic change occurs, the digital value DD exhibits a large change with respect to the amount of that change.

Figure 4:
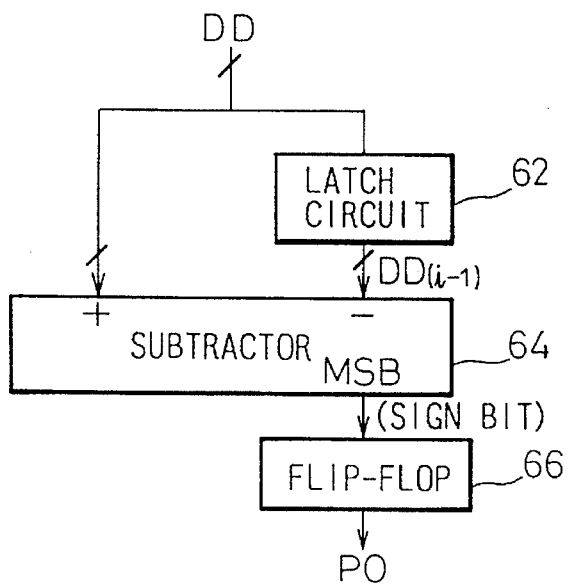
FIG. 4 is a block diagram which shows the configuration of the digital comparator of an embodiment of the present invention.

Next, the digital value DD generated by the above-noted divider 50 is input to the digital comparator 60. This digital comparator 60, as shown in FIG. 4, is formed by a latch circuit 62 which latches the input digital value DD, a subtractor 64 which calculates the difference between the digital value DD(i−1) latched by the latch circuit 62 on the previous time and the digital value DD currently input from the divider 50, and a flip-flop circuit 66 which outputs as a detection signal PC a sign bit signal which indicates whether the result of the calculation by the subtractor 64 is positive or negative.

Essentially, at this digital comparator 60, a signal is generated having a level that is inverted when the digital value DD obtained from the divider 50, which changes in response to changes in magnetic strength, either changes from increasing to decreasing or changes from decreasing to increasing, this being output externally as the detection signal PC.

As described above, in a physical quantity detection device according to this embodiment, pulse signals CKA and CKB having a frequency which changes in response to changes in magnetic strength are caused to be output, counter/decoder sections 22 and 24 generating, based on each of these pulse signals CKA and CKB, the pulse signals PA and PC, and a pulse signal PB having a phase difference with respect to pulse signal PA which varies in a prescribed manner in response to the oscillation frequency of oscillator 16, the phase difference between pulse signals PA and PC and the phase difference between pulse signals PA and PB each being quantized at the pulse phase difference encoding circuit 30, with the ratio DD (=DB/DD) between the quantized digital values DC and DB being determined by the divider 50, the magnetic change being detected from this ratio value DD.

Figure 6:
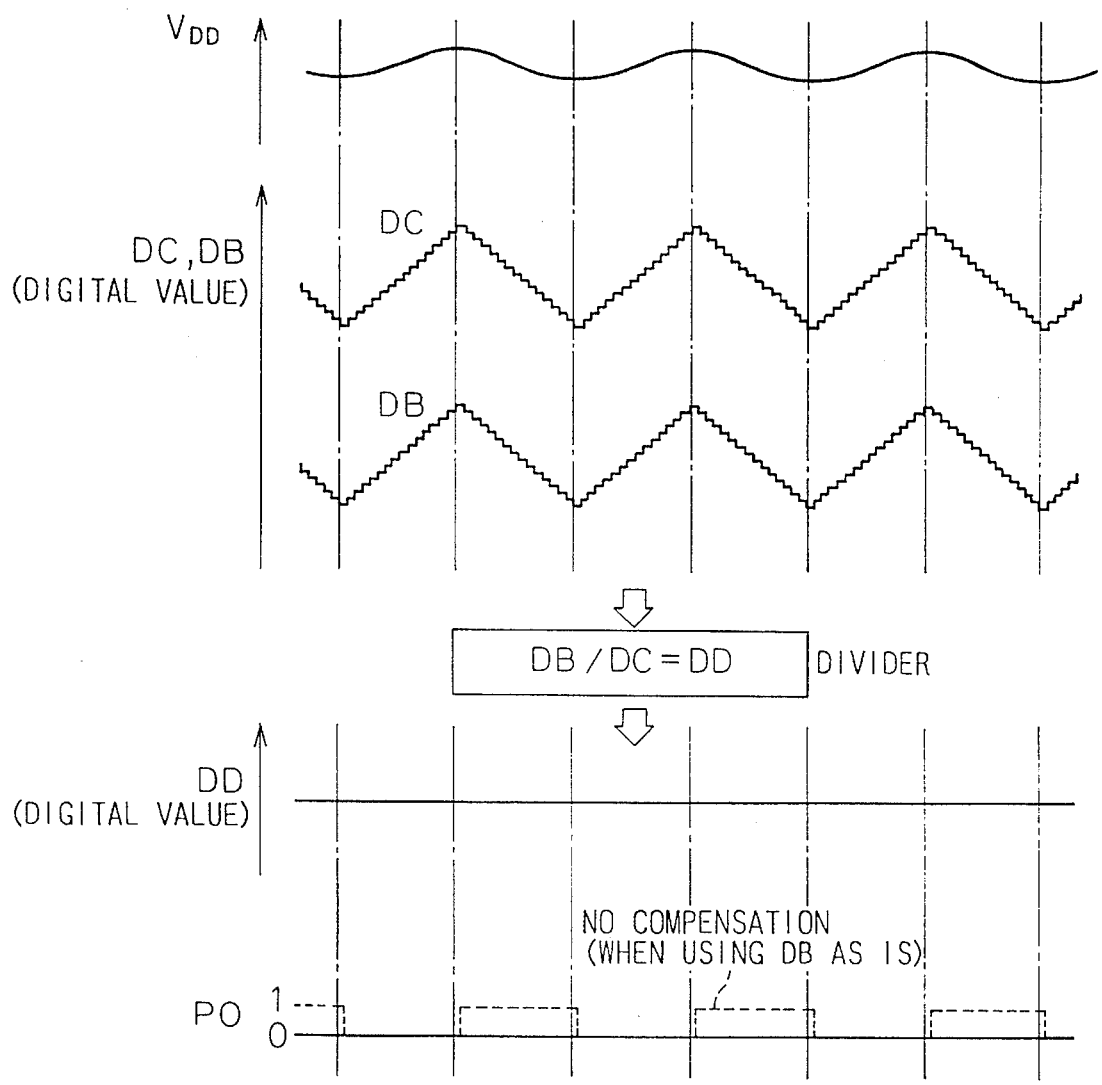
FIG. 6 is a time chart which shows the operation of compensating for the digital value DB in a physical quantity detection device of an embodiment of the present invention.
Figure 7:
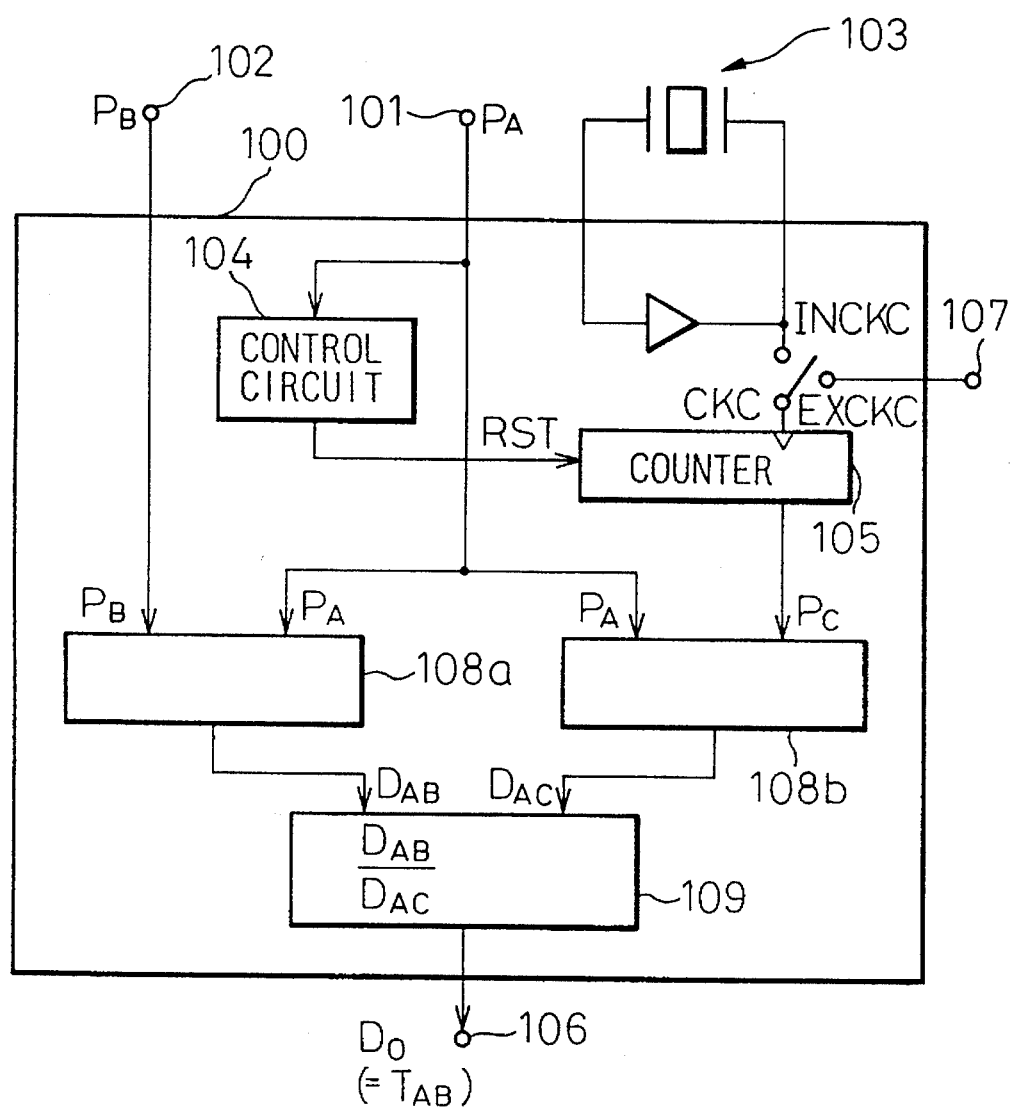
FIG. 7 is a block diagram which shows the configuration of a pulse phase encoding circuit in the prior art.

Therefore, in a physical quantity detection device according to this embodiment, even if a variation in, for example, power supply voltage VDD causes the digital values DB and DC quantized by the pulse phase difference encoding circuit 30 to vary, as shown in FIG. 6, the digital value DD obtained by the divider 50 does not vary, and the detection signal PO, which represents the magnetic variation and is output from the digital comparator 60 does not change.

In essence, when a magnetic change occurs, because the digital value DB which represents the phase difference between pulse signal PA and pulse signal PB changes, if this digital value DB is input to the digital comparator 60 as is, it is possible to obtain a detection signal PO which changes in response to magnetic changes. However, if this is done, if the operating conditions of the device such as the power supply voltage VDD vary; the digital value DB will also change accordingly, so that the detection signal PO output from the digital comparator 60 will, as shown in FIG. 6, change as shown by the dotted line, in spite of the fact that there is no actual change occurring in the magnetic strength. The result is that if this detection signal PO is received by a control device, erroneous control of the controlled quantity will occur. However, in this embodiment of the present invention, even if operating conditions of the device such as the power supply voltage VDD vary, the detection signal PO output from the digital comparator 60 does not change, and because this detection signal PO changes only in response to actual changes occurring in the magnetic strength, it is possible for a control device to sense the magnetic changes and to control the object under control accurately, thereby reliably preventing erroneous control caused by variations in operating conditions of the detection device.

The above has been a description of one embodiment of the present invention. The present invention, however, is not limited to application to such a physical quantity detection device, and can also be applied directly to a time A/D conversion device which quantizes the phase difference between two pulse signals as does in the above-described pulse phase difference encoding circuit 30, and can also be applied to an A/D conversion device which quantizes the voltage level of an input signal.

Although in the above-described the explanation was presented in terms of an embodiment in which a physical quantity detection device detected a magnetic change, by changing the detection circuit of the above-noted embodiment, it is possible to perform detection of physical quantities other than magnetic strength in the same manner as in the above-described embodiment. For example, if strain gauge resistive wires are used in place of the magnetoresistive elements 12 and 14, it is possible to detect strain as the physical quantity.

As another embodiment of the present invention, a pulse frequency or a pulse interval of a pulse signal generated by the pulse generation means, can be used as a signal representing a change in a physical quantity of an object under detection, and accordingly, the pulse generation means or the oscillating means may generates a pulse signal, the pulse interval of which cane varied with respect to the change in the physical quantity.

Therefore, the physical quantity detection device used in the above-mentioned embodiment comprises, for example, a first pulse generation means which outputs a first pulse signal (PCK1), the pulse interval of which varies with a varying size of a physical quantity, a second pulse generation means which outputs a second pulse signal (PCK2), the pulse interval of which varies with a varying size of a physical quantity, a pulse phase difference measurement means which measures the amount of time from a prescribed starting time to the output of the first pulse signal and measures the amount of time from a prescribed starting time to the output of the second pulse signal by converting the data of the frequency or the pulse interval of the first pulse signal (PCK1) into digital data (DC) and the data of the frequency or the pulse interval of the second pulse signal (PCK2) into digital data (DB).

We claim:

1. A physical quantity change detection device comprising:
   a first oscillation means which outputs a first pulse signal CKA, the frequency of which increases with an increasing size of said physical quantity;
   a second oscillation means which outputs a second pulse signal CKB, the frequency of which decreases with an increasing size of said physical quantity;
   a first pulse generation means which inputs said first pulse signal CKA from said first oscillation means and starts to count the number of pulses of said first pulse signal CKA, outputs a pulse signal PA, and outputs a first output pulse signal PC when the number of pulses counted reaches a first prescribed number;
   a second pulse generation means which repeats the operations of inputting the second pulse signal, beginning to count said second pulse signal CKB from a prescribed starting time, and then outputting an output pulse signal PB when the counting of a second prescribed number of times is completed;
   a pulse phase difference encoding circuit which inputs output pulse signals PB and PC from said first and second pulse generation means, and outputs digital values DB and DC which correspond respectively to the time from the prescribed starting time to a rising edge of said output pulse signal PB and to the time from the prescribed starting time to a rising edge of said output pulse signal PC; and
   a ratio output means which determines and outputs a ratio of said digital value DB and said digital value DC, wherein said physical quantity change is detected from a change in said ratio output by said output means,
   wherein said first pulse generation means outputs a pulse signal PA until the counted value reaches a third prescribed number after counting and wherein said pulse phase difference encoding circuit inputs said pulse signal PA from said first pulse generation means and said prescribed starting time in said pulse phase difference encoding circuit is an input starting time of said pulse signal PA.

2. A physical quantity change detection device, comprising:
   a first oscillation means which outputs a first pulse signal, the frequency of which increases with an increasing size of said physical quantity;
   a second oscillation means which outputs a second pulse signal, the frequency of which decreases with the increasing size of said physical quantity;
   a first pulse generation means which repeats the operations of inputting said first pulse signal, beginning to count said first pulse signal from a prescribed starting time, and then outputting an output pulse signal PC when the counting of a first prescribed number of times is completed;
   a second pulse generation means which repeats the operations of inputting the second pulse signal, beginning to count said second pulse signal from a prescribed starting time, and then outputting an output pulse signal PB when the counting of a second prescribed number of times is completed;
   a pulse phase difference encoding circuit which measures the amount of time from said prescribed starting time to the output of said output pulse signal PC, and along with outputting a first time signal corresponding to the measured time, also measures the amount of time from said starting time to the output of said output pulse signal PB and outputs a second time signal corresponding to the measured time; and
   a ratio output means which determines and outputs the ratio of said first time signal and said second time signal wherein said physical quantity change is detected from a change in said ratio outputted by said output means;
   wherein said first oscillation means has a physical quantity detection element having a detected value that increases as the size of said physical quantity acting on it increases and a first oscillator which is connected to said physical quantity detection element and which outputs a pulse signal CKA having an oscillation frequency which increases with an increase in said detected value, and further wherein said second oscillation means has a physical quantity detection element having a detected value that decreases as the size of said physical quantity acting on it increases and a second oscillator which is connected to said physical quantity detection element and which outputs a pulse signal CKB having an oscillation frequency which decreases with a decrease in said detected value, and further wherein said first pulse generation means inputs said pulse signal CKA from said first oscillator and starts to count the number of pulses of said pulse signal CKA, outputting a pulse signal PA until the counted value reaches a third prescribed number, and outputting said output pulse signal PC when the counted value reaches a first prescribed number, said second pulse generation means inputting said pulse signal CKB from said second oscillator and starting to count the number of pulses of said pulse signal CKB simultaneously with the start of the counting of the pulses of said pulse signal CKA by said first counter/decoder section, and having a second counter/decoder section which outputs said output pulse signal PB when the counted value of the number of pulses of said pulse signal CKB reaches a second prescribed number, and further wherein said pulse phase difference encoding circuit inputs said pulse signal PA and output pulse signals PB and PC output from said first and second counter/decoder sections, and outputs digital values DB and DC which correspond respectively to the time from a rising edge of said pulse signal PA to a rising edge of said output pulse signal PB and to the time from the rising edge of said pulse signal PA to a rising edge of output said pulse signal PC, and wherein said ratio output means determines and outputs the ratio of said digital values DB and DC.

3. A physical quantity change detection device according to claim 2, wherein said first oscillation means has a physical quantity detection element having a detected value that increases as the size of said physical quantity acting on it increases and a first oscillator which is connected to said physical quantity detection element and which outputs a pulse signal CKA having an oscillation frequency which increases with an increase in said detected value, and further wherein said second oscillation means has a second physical quantity detection element which has the same characteristics as said first physical quantity detection element, and a second oscillator which is connected to said second physical quantity detection element and which outputs a pulse signal CKB having an oscillation frequency which decreases with an increase in said detected value.

4. A physical quantity change detection device comprising:

a first oscillation means which outputs a first pulse signal CKA, the pulse interval of which varies with a varying size of said physical quantity;

a second oscillation means which outputs a second pulse signal CKB, the pulse interval of which varies with the varying size of said physical quantity;

a first pulse generation means which repeats the operations of inputting said first pulse signal CKA, beginning to count said first pulse signal CKA from a prescribed starting time, and then outputting an output pulse signal PC when the counting of a first prescribed number of times is completed;

a second pulse generation means which repeats the operations of inputting the second pulse signal CKB, beginning to count said second pulse signal CKB from the prescribed starting time, and then outputting an output pulse signal PB when the counting of a second prescribed number of times is completed;

a pulse phase difference measurement means which measures an amount of time from said prescribed starting time to the output of said output pulse signal PC, and along with outputting a first time signal corresponding to the measured time, also measures an amount of time from said prescribed starting time to the output of said output pulse signal PB, and outputs a second time signal corresponding to the measured time; and a ratio output means which determines and outputs the ratio of said first time signal and said second time signal wherein said physical quantity change is detected from a change in said ratio outputted by said output means; and wherein said second pulse generation means inputs said pulse signal CKB from said second oscillation means and starts to count the number of pulses of said pulse signal CKB simultaneously with the start of the counting of the pulses of said first pulse signal CKA by said first pulse generation means, and said second pulse generator means outputs said output pulse signal PB when the counted value of the number of pulses of said second pulse signal CKB reaches a second prescribed number.

5. A physical quantity change detection device comprising:

a first pulse generation means which outputs a first pulse signal PB, the pulse interval of which varies with a varying size of said physical quantity;

a second pulse generation means which outputs a second pulse signal PC, the pulse interval of which varies with the varying size of said physical quantity;

a pulse phase difference measurement means which measures an amount of time from a prescribed starting time to the output of said first pulse signal PB, and along with outputting a first time signal corresponding to the measured time, also measures an amount of time from said prescribed starting time to the output of said second pulse signal PC and outputs a second time signal corresponding to the measured time; and ratio output means which determines and outputs a ratio of said first time signal and said second time signal wherein said physical quantity change is detected from a change in said ratio output by said ratio output means; and wherein said second pulse generation means inputs a pulse signal CKB from a second oscillator and starts to count the number of pulses of said pulse signal CKB simultaneously with the start of counting of the pulses of a pulse signal CKA by said first pulse generation means, and has a second counter/decoder section which outputs said output pulse signal PB when the counted value of the number of pulses of said pulse signal CKB reaches a second prescribed number.

* * * * *